United States Patent
Miyaki

(10) Patent No.: US 7,042,918 B2
(45) Date of Patent: May 9, 2006

(54) TUNABLE LASER SOURCE

(75) Inventor: Shosuke Miyaki, Tokyo (JP)

(73) Assignee: Yokogawa Electric Corporation, Tokyo (JP)

( * ) Notice: Subject to any disclaimer, the term of this patent is extended or adjusted under 35 U.S.C. 154(b) by 0 days.

(21) Appl. No.: 11/227,073

(22) Filed: Sep. 16, 2005

(65) Prior Publication Data

US 2006/0062263 A1   Mar. 23, 2006

(30) Foreign Application Priority Data

Sep. 17, 2004   (JP) .................. P. 2004-271408

(51) Int. Cl.
*H01S 3/10* (2006.01)
*H01S 3/08* (2006.01)

(52) U.S. Cl. .............. 372/20; 372/92; 372/102

(58) Field of Classification Search .......... 372/20, 372/92, 93, 102
See application file for complete search history.

(56) References Cited

U.S. PATENT DOCUMENTS

| | | | | |
|---|---|---|---|---|
| 5,491,714 A * | 2/1996 | Kitamura | ............. | 372/92 |
| 5,594,744 A * | 1/1997 | Lefevre et al. | ............. | 372/20 |
| 5,867,512 A * | 2/1999 | Sacher | ............. | 372/20 |
| 5,982,794 A * | 11/1999 | Tamura | ............. | 372/29.012 |
| 6,018,535 A * | 1/2000 | Maeda | ............. | 372/20 |
| 6,330,253 B1 * | 12/2001 | Tuganov et al. | ............. | 372/9 |
| 6,625,183 B1 * | 9/2003 | Hand et al. | ............. | 372/20 |
| 6,690,690 B1 * | 2/2004 | Marron | ............. | 372/20 |
| 6,731,661 B1 * | 5/2004 | Trutna, Jr. | ............. | 372/20 |
| 6,778,564 B1 * | 8/2004 | Funakawa | ............. | 372/20 |
| 6,850,545 B1 * | 2/2005 | Asami | ............. | 372/20 |
| 6,856,632 B1 * | 2/2005 | Heanue et al. | ............. | 372/20 |

FOREIGN PATENT DOCUMENTS

JP       2002-190642 A      7/2002

OTHER PUBLICATIONS

Karen Liu, et al., "Novel Geometry for single-mode scanning of tunable laser", Optics Letters, Mar. 1981, pp. 117-118, vol. 6, No. 3.

* cited by examiner

*Primary Examiner*—James Menefee
(74) *Attorney, Agent, or Firm*—Sughrue Mion, PLLC

(57) ABSTRACT

A tunable laser source of a Littman arrangement type has a wavelength selection mirror rotating around a position where a mode hop is suppressed in a wavelength variation, a feed screw receiving a driving force of a motor at one end to be rotated, in which another end is disposed at a predetermined position, and which is larger in coefficient of thermal expansion than the optical base, a first nut feedably fitted to the feed screw, a flat spring in which one end is fixed to the first nut; and a mirror arm having a rotation shaft disposed at a rotation center of the wavelength selection mirror, and first and second arm portions formed in a V-like shape and elongating from the rotation shaft. The wavelength selection mirror is fixed to the first arm portion, and another end of the flat spring is fixed to the second arm portion.

2 Claims, 5 Drawing Sheets

P1
ROTATION CENTER
OF WAVELENGTH
SELECTION MIRROR

TUNABLE LASER SOURCE

CROSS-REFERENCE TO RELATED APPLICATIONS

This application is based upon and claims the benefit of priority from the prior Japanese Patent Applications No. 2004-271408, filed on Sep. 17, 2004, the entire contents of which are incorporated herein by reference.

BACKGROUND OF THE INVENTION

1. Field of the Invention

The invention relates to a tunable laser source of a Littman arrangement type, including a semiconductor laser and a diffraction grating which are fixed to an optical base, and a wavelength selection mirror which rotates around a position, as a rotation center, where a mode hop is suppressed at a time of a wavelength variation. The invention particularly relates to a tunable laser source in which a wavelength error with respect to influence of a temperature change can be suppressed without using a heat insulation structure.

2. Description of the Related Art

FIG. 5 shows the configuration of an external resonator type tunable laser source as a related art (For example, see Document 1 and Document 2.). With reference to FIG. 5, an external resonator type tunable laser source in a Littman arrangement will be described as an example. An optical amplifier 10 has a semiconductor laser 11, a first lens 12, and a second lens 13. The semiconductor laser 11 has an antireflection film 11a at one end. A wavelength selection section 20 has a diffraction grating 21 and a wavelength selection mirror 22, selects the wavelength of the light to be emitted from the one end of the optical amplifier 10, and feedbacks the selected light to the optical amplifier 10.

Light emitted from the one end (the end face where the antireflection film 11a is formed) of the semiconductor laser 11 is converted to parallel light by the first lens 12, and then enters the diffraction grating 21. The light entering the diffraction grating 21 is diffracted by the diffraction grating 21, wavelength-dispersed to different angles depending on the wavelength, and then enters the wavelength selection mirror 22. Among the light incident on the wavelength selection mirror 22, only the light of a desired wavelength is reflected to the diffraction grating 21 through the same optical path.

The light incident on the diffraction grating 21 is again wavelength-dispersed. Only the light of the wavelength selected by the wavelength selection section 20 is converged in the semiconductor laser 11 by the first lens 12 to be fed back. The other end of the semiconductor laser 11, and the wavelength selection mirror 22 form an external resonator, and perform laser oscillation.

By contrast, the laser light emitted from the other end which is not provided with the antireflection film 11a is converted to parallel light by the second lens 13. The parallel light is passed through an isolator which is not shown, and emitted as output light.

The rotation center P1 of the wavelength selection mirror 22 is a point at the intersection of an extension of the diffracting plane of the diffraction grating 21, that of the reflecting plane of the wavelength selection mirror 22, and that of a plane constituting the external resonator (strictly speaking, slightly shifted by the refractive index of the semiconductor laser 11 to the side of the second lens 13 with respect to the reflecting face or the other end of the semiconductor laser 11). The arrangement of the semiconductor laser 11, the diffraction grating 21, and the wavelength selection mirror 22 is called a Littman arrangement (or a sine-bar arrangement). In the Littman arrangement, generation of a mode hop can be prevented from occurring over a broad band, and a continuous wavelength sweep with a reduced power variation is enabled. Namely, the rotation center P1 is located at a position where a mode hop is suppressed when a wavelength is tuned.

A rotation shaft of a mirror arm 31 is disposed at the rotation center P1, and the wavelength selection mirror 22 is fixed to the mirror arm. A stepping motor (hereinafter, abbreviated to motor) 32 is contacted with one end of the mirror arm 31 via a screw 33. A tension spring 34 is disposed in parallel with the screw 33.

For example, the motor 32 is rotated to cause the screw 33 to push the mirror arm 31 (in FIG. 5, in the leftward direction). This causes the mirror arm 31 to be rotated about the rotation center P1 while maintaining the Littman arrangement. Therefore, the wavelength selected by the wavelength selection section 20, and the optical path length of the diffraction grating 21 and the wavelength selection mirror 22 are changed, and also the wavelength of the output light is changed toward a shorter wavelength side.

When the motor 32 is rotated in the opposite direction, the screw 33 is moved in the direction along which the screw is separated from the mirror arm 31 (in FIG. 5, in the rightward direction), and the mirror arm 31 is pulled toward the motor 32 by the tension spring 34. This causes the mirror arm 31 to be rotated about the rotation center P1 while maintaining the Littman arrangement. Therefore, the wavelength selected by the wavelength selection section 20, and the optical path length of the diffraction grating 21 and the wavelength selection mirror 22 are changed, and also the wavelength of the output light is changed toward a longer wavelength side.

The mirror arm 31 to which the wavelength selection mirror 22 is fixed is rotated about the rotation center P1, whereby a wavelength sweep is performed.

The following documents are referred to as related art.

[Document 1] G. Littman et al., "Novel Geometry for single-mode scanning of tunable lasers," OPTICAL LETTERS, Optical Society of America, March 1981, Vol. 6, No. 3, pp. 117–118.

[Document 2] JP-A-2002-190642 (paragraph [0002] to [0004], FIGS. 6 to 8).

In the tunable laser source shown in FIG. 5, the wavelength is tuned by rotating the wavelength selection mirror 22. In order to stably output a desired wavelength, the length of the external resonator extending from the semiconductor laser 11 to the wavelength selection mirror 22 via the diffraction grating 21 must be always constant. In order to make the tunable laser source free from a mode hop, a sine-bar arrangement must be employed as shown in FIG. 5.

Usually, the optical amplifier 10, the wavelength selection section 20, and the mirror arm 31 are arranged on an optical base which is not shown. Therefore, thermal expansion or contraction is caused in the optical base itself by a change of the ambient temperature or a variation of heat generation of the semiconductor laser 11. Consequently, the positional relationships of the optical amplifier 10, the wavelength selection section 20, and the mirror arm 31 which are arranged on the optical base are varied, and the length of the external resonator is changed, thereby producing a problem in that a wavelength error occurs.

In order to eliminate the influence of thermal expansion or contraction of an optical base, it is matter of course that the whole of a tunable laser source may be configured as a heat insulation structure. However, the size of the entire light source is very large.

SUMMARY OF THE INVENTION

An object of the invention is to provide a tunable laser source in which a wavelength error with respect to influence of a temperature change can be suppressed without using a heat insulation structure.

The invention provides a tunable laser source of a Littman arrangement type, having: a semiconductor laser and a diffraction grating fixed to an optical base; a wavelength selection mirror which rotates around a position, as a rotation center thereof, where a mode hop is suppressed at a time of a wavelength variation; a motor; a feed screw which receives a driving force of the motor at one end to be rotated, in which another end thereof is disposed at a predetermined position with respect to the optical base, and which is larger in coefficient of thermal expansion than the optical base; a first nut which is feedably fitted to the feed screw; a flat spring in which one end thereof is fixed to the first nut; and a mirror arm which has a rotation shaft disposed at the rotation center of the wavelength selection mirror, and first and second arm portions formed in a substantially V-like shape and elongating from the rotation shaft, wherein the wavelength selection mirror is fixed to the first arm portion of the mirror arm, and another end of the flat spring is fixed to the second arm portion of the mirror arm.

The tunable laser source further has: a second nut which is feedably fitted to the feed screw, and is disposed on a side of the another end of the feed screw with respect to the first nut; a plate which is fixed to the first nut, and is contacted with the second nut to prevent the second nut from rotating; and a compression spring disposed between the second nut and the first nut, wherein the first nut is larger in coefficient of thermal expansion than the feed screw.

According to the tunable laser source, the optical base thermally expands or contracts, and the feed screw thermally expands or contracts in a degree larger than the optical base, while a point where the feed screw is at a predetermined position with respect to the optical base is set as a reference point. Even when the motor is not rotated, the mirror arm is rotated in a direction along which a variation of the length of the external resonator is corrected, via the first nut and the flat spring in accordance with the thermal expansion or contraction of the feed screw. As a result, a wavelength error with respect to influence of a temperature change can be suppressed without using a heat insulation structure, and the light source can be miniaturized.

The first nut performs a linear motion, and the mirror arm performs a rotary motion centered at the rotation center. However, the flat spring couples the first nut with the second arm portion of the mirror arm. When the flat spring is deformed, therefore, the linear force of the first nut can be transmitted to the rotational force of the mirror arm without applying undue force to the mirror arm. As a result, the mirror arm can be smoothly rotated.

Further, when the optical base thermally expands, the first nut thermally expands in a degree larger than the feed screw, and hence the inner diameter is increased. Since the compression spring is disposed between the first and second nuts, the compression spring always pushes the first nut toward the motor. Therefore, the first nut is rotated via the flat spring in a direction along which a variation of the length of the external resonator is corrected (specifically, in a direction along which the length of the external resonator is shortened). Consequently, a wavelength error with respect to influence of a temperature change can be further suppressed without using a heat insulation structure.

DETAILED DESCRIPTION OF THE PREFERRED EMBODIMENTS

Embodiments of the invention will be described with reference to the accompanying drawings.

First Embodiment

Figure 1:
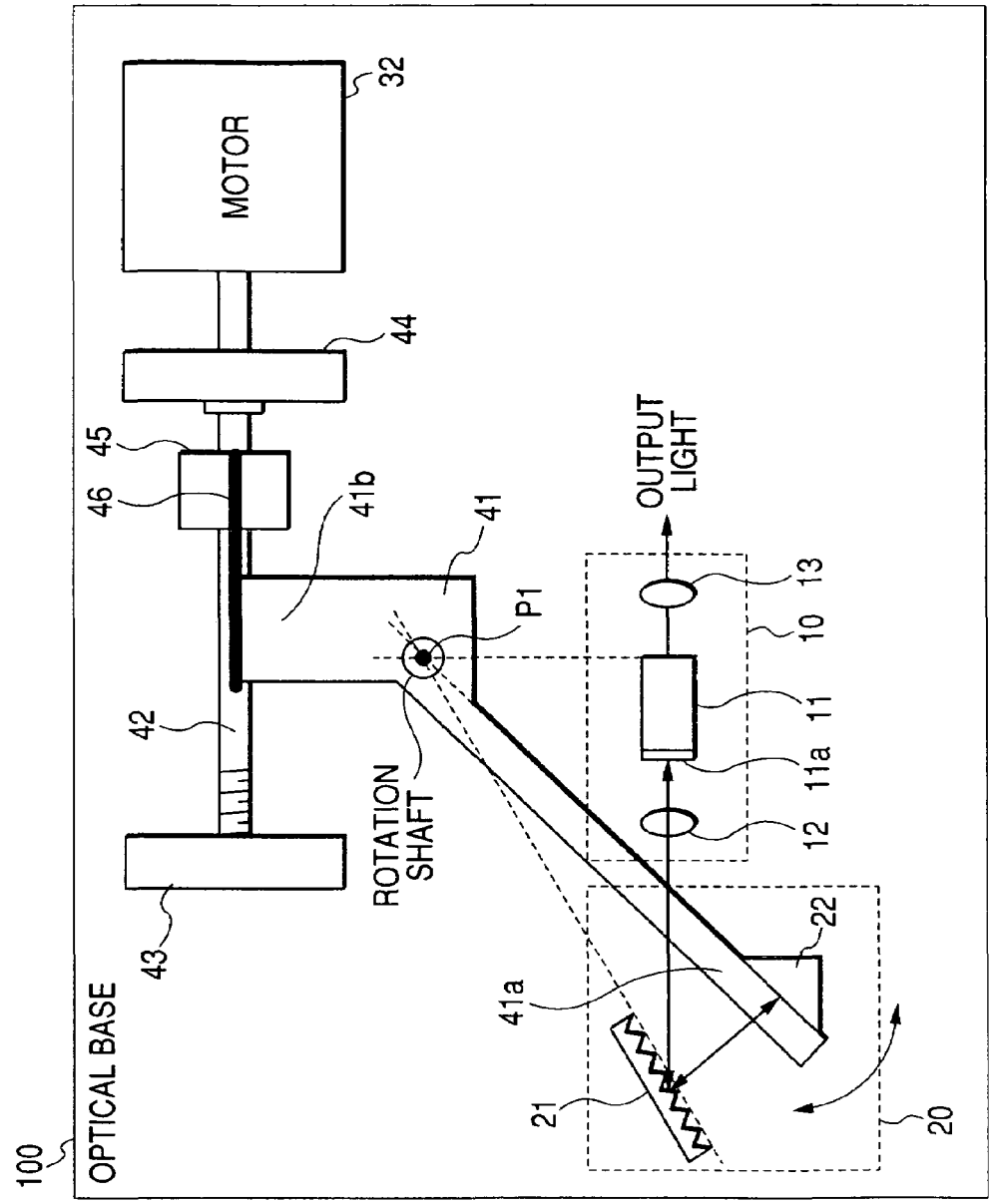
FIG. 1 is a diagram showing the configuration of a first embodiment of the invention.
Figure 5:
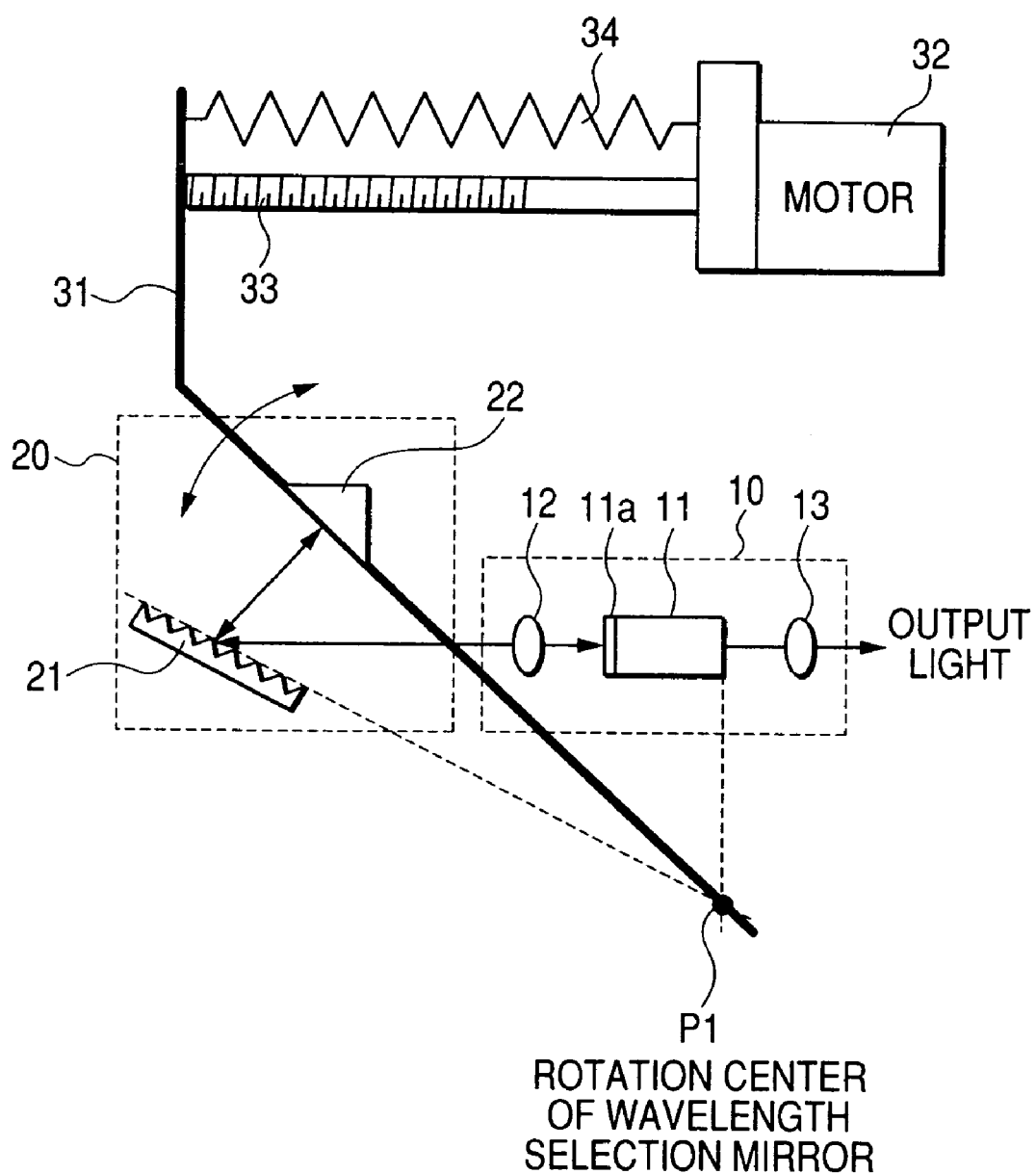
FIG. 5 is a diagram showing the configuration of an external resonator type tunable laser source in a Littman arrangement as a related art.

FIG. 1 is a diagram showing the configuration of a first embodiment of the invention. The components which are identical with those of FIG. 5 are denoted by the same reference numerals, and their description is omitted. In FIG. 1, the components 11 to 13 of the optical amplifier 10, the diffraction grating 21, and the motor 32 are fixed onto an optical base 100. A mirror arm 41 is disposed in place of the mirror arm 31. The rotation shaft of the mirror arm 41 is disposed at the rotation of the wavelength selection mirror 22. A first arm portion 41a and a second arm portion 41b elongate from the rotation shaft to form a substantially V-like shape. The wavelength selection mirror 22 is fixed to the first arm portion 41a.

A feed screw 42 is disposed in place of the screw 33. The tension spring 34 is removed away. Holders 43, 44 which hold the feed screw 42 are newly disposed, and fixed to the optical base 100. In the feed screw 42, one end is held by the holder 44 and receives driving force of the motor 32 to be rotated, and the other end is held by the holder 43. The screw 42 is movable with respect to the holder 44 in the axial direction, and the tip of the other end is always in contact with the holder 43. Therefore, the tip of the other end of the screw 42 is at a predetermined position with respect to the optical base 100. The coefficient of thermal expansion of the screw 42 is larger than that of the optical base 100.

A first nut 45 is newly disposed, and feedably fitted to the feed screw 42. A flat spring 46 is newly disposed. One end of the flat spring is fixed to the first nut 45, and the other end is fixed to an end face of the second arm portion 41b. Therefore, the flat spring 46 also serves to prevent the first nut 45 from rotating.

The operation of the thus configured light source will be described.

First, the operation of a wavelength sweep will be described. The case where, for example, the length of the optical path of the diffraction grating 21 and the wavelength selection mirror 22, i.e., the external resonator is to be prolonged will be first described. When the motor 32 is rotated, the screw 42 receives the driving force of the motor 32 to be rotated. This rotation causes the nut 45 to be moved toward the holder 43 along the axis of the screw 42 (in FIG.

1, in the leftward direction). Therefore, the mirror arm 41 is rotated about the rotation center P1 in a counterclockwise direction while maintaining the Littman arrangement. Consequently, the wavelength selected by the wavelength selection section 20 is changed, and also the wavelength of the output light is changed.

By contrast, in the case where the length of the optical path of the diffraction grating 21 and the wavelength selection mirror 22, i.e., the external resonator is to be shortened, the motor 32 is reversely rotated, and the screw 42 receives the driving force of the motor 32 to be rotated. This rotation causes the nut 45 to be moved toward the motor 32 along the axis of the screw 42 (in FIG. 1, in the rightward direction). Therefore, the mirror arm 41 is rotated about the rotation center P1 in a clockwise direction while maintaining the Littman arrangement. Consequently, the wavelength selected by the wavelength selection section 20 is changed, and also the wavelength of the output light is changed.

As described above, the mirror arm 41 to which the wavelength selection mirror 22 is fixed is rotated about the rotation center P1, whereby a wavelength sweep is performed.

Then, the operation in the case where the temperature is varied and the optical base 100 thermally expands or contracts will be described with reference to FIG. 2. The components which are identical with those of FIG. 1 are denoted by the same reference numerals, and their description is omitted. The arrow indicative of the optical path, and symbols which are not related to the description of the operation are not shown.

First, the operation in the case where the optical base 100 thermally expands will be described. When the optical base 100 thermally expands, the positions of the semiconductor laser 11 and the diffraction grating 21 which are fixed to the optical base 100 are moved. In accordance with the expansion of the mirror arm 41, also the mirror 22 is moved. As a result, the length of the external resonator is prolonged. In the diffraction grating 21, the number of grooves per unit length is reduced by the thermal expansion, and hence the selected wavelength is shifted to a longer side in synchronization with the change of the length of the optical path. On the other hand, also the feed screw 42 expands. Since the coefficient of thermal expansion of the screw 42 is larger than that of the optical base 100 and the other end of the screw 42 is contacted with the holder 43, the screw expands toward the motor 32 in a degree larger than the optical base 100 while setting the position where the screw is in contact with the holder 43 as a reference point (See the arrow A1 in FIG. 2.).

Figure 2:
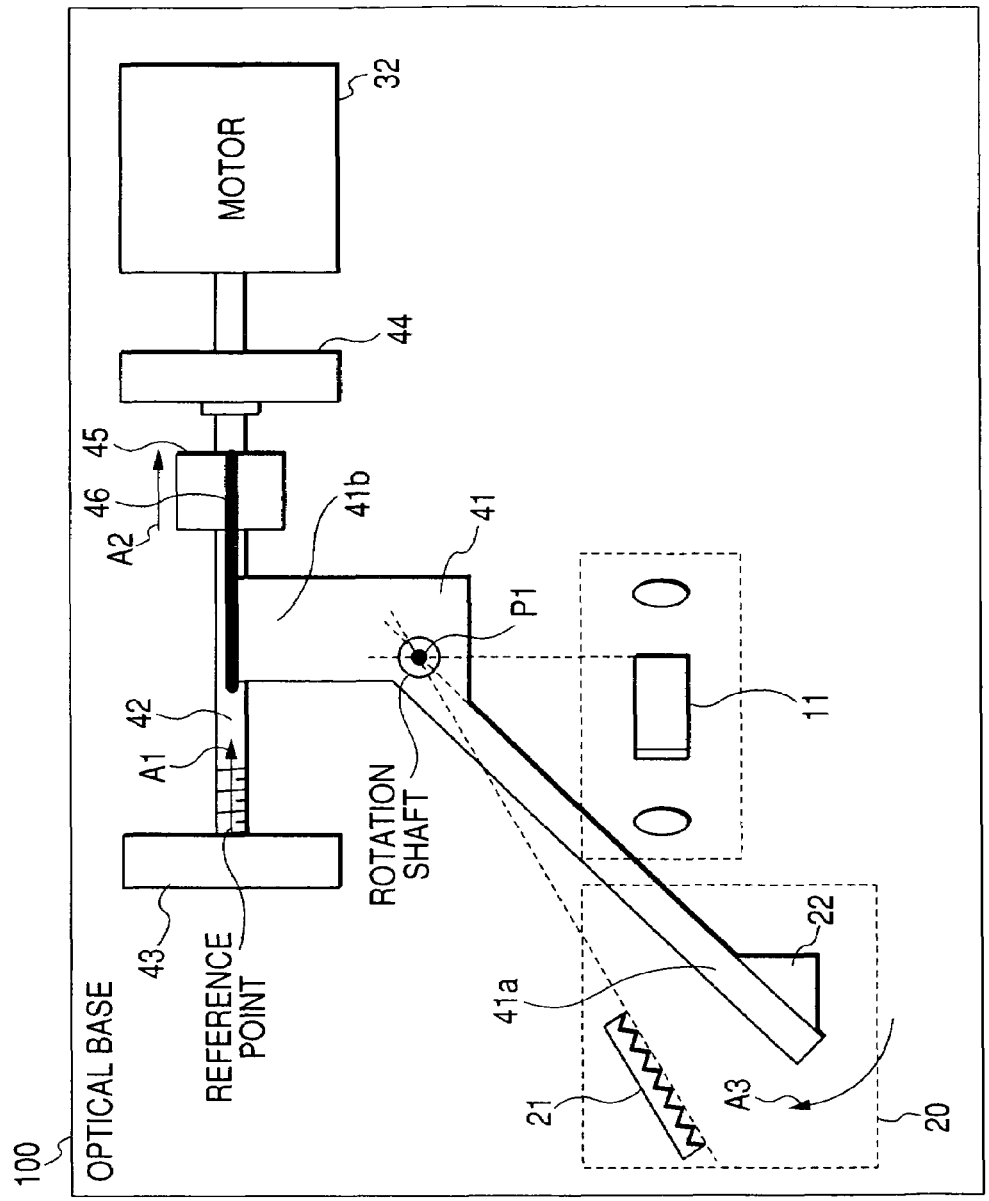
FIG. 2 is a diagram illustrating the operation of the light source shown in FIG. 1 during thermal expansion.

Even when the motor 32 is not rotated, therefore, also the nut 45 is moved toward the motor 32 (see the arrow A2 in FIG. 2). Since the second arm portion 41b of the mirror arm 41 is coupled to the nut 45 via the flat spring, of course, the wavelength selection mirror 22 fixed to the first arm portion 41a of the mirror arm 41 is rotatingly moved about the rotation center P1 in the direction toward the diffraction grating 21 (See the arrow A3 in FIG. 2.).

By contrast, in the case where the optical base 100 thermally contracts, the light source operates in a manner opposite to the case of the thermal expansion, and the wavelength selection mirror 22 is rotatingly moved about the rotation center P1 in the direction along which the mirror is separated from the diffraction grating 21.

The operation in which the semiconductor laser 11 cooperates with the wavelength selection mirror 22 to perform laser oscillation via the diffraction grating 21 and laser light is emitted from the other end of the semiconductor laser 11 is identical with that of the light source shown in FIG. 5. Therefore, its description is omitted.

As described above, the optical base 100 thermally expands or contracts, and the feed screw 42 thermally expands or contracts in a degree larger than the optical base 100 while setting the position where the screw is in contact with the holder 43 as a reference point. Even when the motor 32 is not rotated, the mirror arm 41 is rotated in a direction along which a variation of the length of the external resonator is corrected, via the nut 45 and the flat spring 46 in accordance with the thermal expansion or contraction of the feed screw 42. As a result, a wavelength error with respect to influence of a temperature change can be suppressed without using a heat insulation structure, and the light source can be miniaturized.

The nut 45 performs a linear motion, and the mirror arm 41 performs a rotary motion centered at the rotation center P1. However, the flat spring 46 couples the nut 45 with the second arm portion 41b of the mirror arm 41. When the flat spring 46 is deformed, therefore, the linear force of the nut 45 can be transmitted to the rotational force of the mirror arm 41 without applying undue force to the mirror arm 41. As a result, the mirror arm 41 can be smoothly rotated.

Second Embodiment

Figure 3:
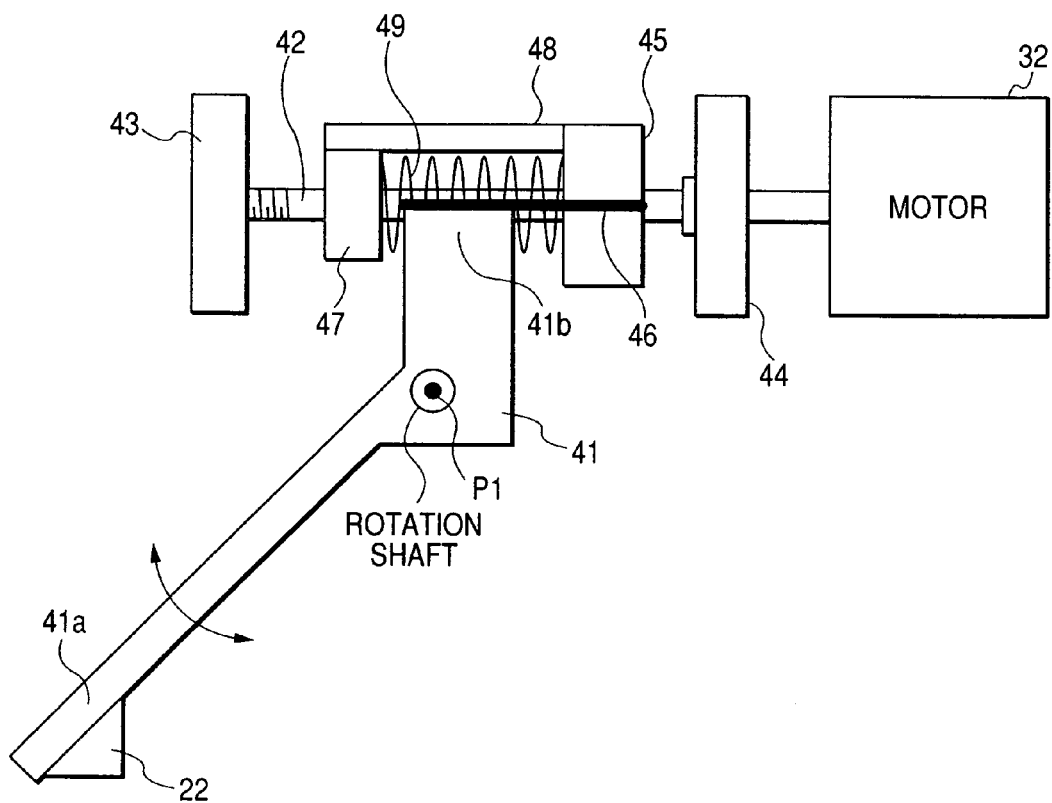
FIG. 3 is a diagram showing the configuration of a second embodiment of the invention.

FIG. 3 is a diagram showing the configuration of a second embodiment of the invention. The components which are identical with those of FIG. 1 are denoted by the same reference numerals, and their description is omitted. The optical base 100, the optical amplifier 10, and the diffraction grating 21 are not shown. Referring to FIG. 3, a second nut 47 which is feedably fitted to the feed screw 42, and which is disposed on the other end side of the feed screw 42 with respect to the first nut 45 is newly disposed. The coefficient of thermal expansion of the first nut 45 is larger than that of the feed screw 42.

Furthermore, a plate 48 which couples the second nut 47 with the first nut 45 is newly disposed. The plate 48 is fixed to the first nut 45 by screws which are not shown, and contacted with the second nut 47 to prevent the second nut from rotating. A coil-like compression spring 49 is newly disposed between the second nut 47 and the first nut 45. The outer periphery of the second nut 47 is processed so as to be in surface contact with the plate 48.

Figure 4A:
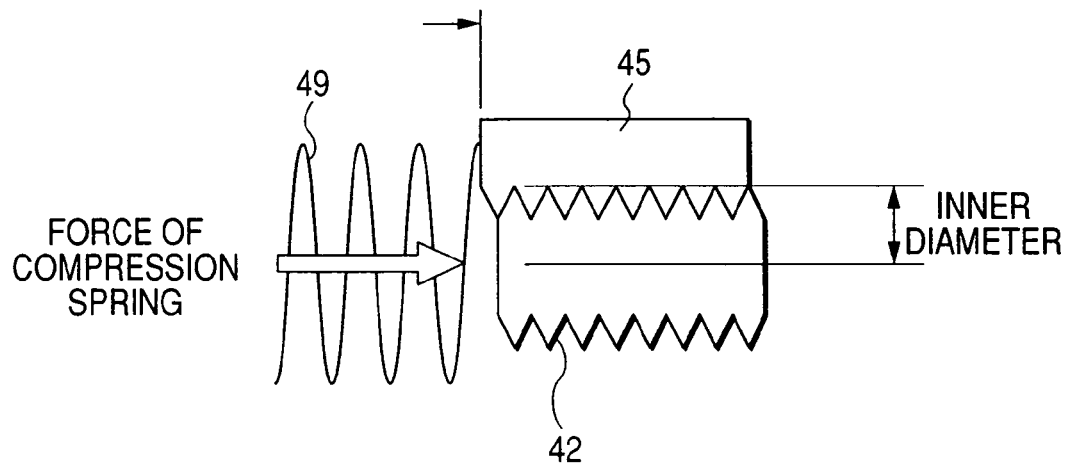
FIGS. 4A and 4B are diagrams showing in detail a portion of the light source shown in FIG. 3.
Figure 4B:
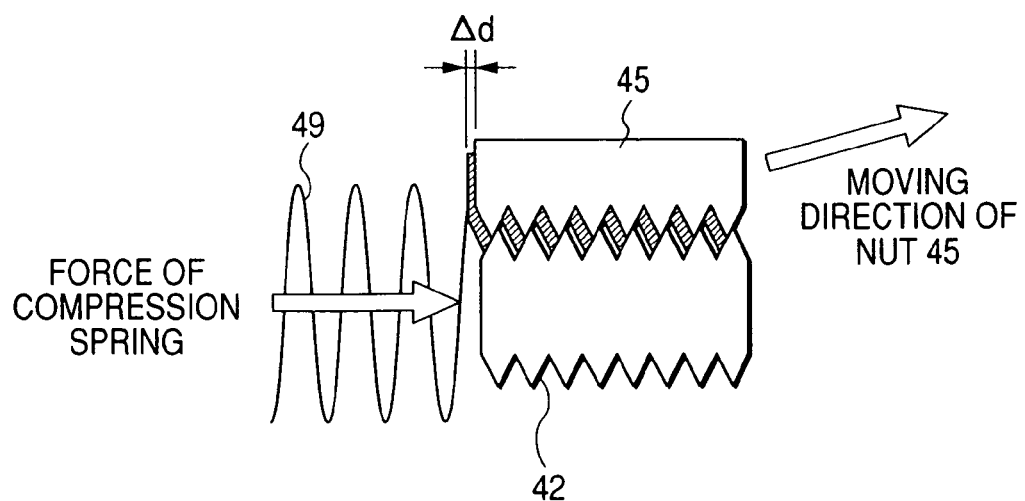

The operation of the thus configured light source will be described. FIGS. 4A and 4B are diagrams showing in detail a portion where the feed screw 42, the first nut 45, and the compression spring 49 which are shown in FIG. 3 are in contact. FIG. 4A is a diagram showing the portion before thermal expansion, and FIG. 4B is a diagram showing the portion after thermal expansion. The components which are identical with those of FIG. 3 are denoted by the same reference numerals, and their description is omitted. Actually, the screw 42 is passed through the center of the compression spring 49, but omitted in FIGS. 4A and 4B.

Before the optical base 100 thermally expands, the feed screw 42 and the nut 45 are screwed with each other without forming a substantially gap as shown in FIG. 4A. The nut 45 is always urged toward the motor 32 by the compression spring 49 which is disposed between the nuts 45, 47.

When the optical base 100 thermally expands, also the nut 45 thermally expands as shown in FIG. 4B. The nut 45 thermally expands in a degree larger than the feed screw 42, and hence the inner diameter is increased, but is pushed toward the motor 32 by the compression spring 49 to be moved toward the motor 32. The nut 45 before thermal expansion is indicated by hatching. Since the second arm portion 41b of the mirror arm 41 is coupled to the nut 45 via the flat spring, even when the motor 32 is not rotated, the wavelength selection mirror 22 fixed to the first arm portion 41a of the mirror arm 41 is rotatingly moved about the rotation center P1 in the direction toward the diffraction grating 21 in the same manner as the arrow A3 in FIG. 2. The operation is identical with that of the light source shown in FIG. 1 except the above-mentioned operation, and therefore the description is omitted.

When the optical base 100 thermally expands in this way, the first nut 45 thermally expands in a degree larger than the feed screw 42, and hence the inner diameter is increased. Since the compression spring 49 is disposed between the nuts 45, 47, the compression spring 49 always urges the nut 45 toward the motor 32. Therefore, the mirror arm 41 is rotated via the flat spring 46 in a direction along which a variation of the length of the external resonator is corrected (specifically, in a direction along which the length of the external resonator is shortened). Consequently, a wavelength error with respect to influence of a temperature change can be further suppressed without using a heat insulation structure.

Even when the first nut 45 expands or contracts by thermal expansion or contraction, the first nut 45 and the feed screw 42 are always screwed with each other at a predetermined force by the compression spring 49. When the motor 32 is driven to rotate the feed screw 42, therefore, the driving torque is constant irrespective the temperature, and hence it is possible to reduce backlash.

The invention is not restricted to these embodiments, and may be configured in the following manner.

In the tunable laser sources shown in FIGS. 1 and 3, the configuration in which the holders 43, 44 are attached and fixed to the optical base 100 has been described. Alternatively, the holders may be formed integrally with the optical base 100.

In the tunable laser source shown in FIG. 3, the configuration in which the compression spring 49 has a coil-like shape has been described. In summary, the compression spring has any shape as far as it can urge the nut 45 toward the motor 32.

In the tunable laser source shown in FIG. 3, the configuration in which the coefficient of thermal expansion of the first nut 45 is larger than that of the feed screw 42 has been described. Alternatively, the coefficients of thermal expansion of the first nut 45 and the feed screw 42 may be substantially equal to each other, and the compression spring 49 may be used simply for reducing backlash.

What is claimed is:

1. A tunable laser source of a Littman arrangement type, comprising:
   a semiconductor laser and a diffraction grating fixed to an optical base;
   a wavelength selection mirror which rotates around a position, as a rotation center thereof, where a mode hop is suppressed at a time of a wavelength variation;
   a motor;
   a feed screw which receives a driving force of the motor at one end to be rotated, in which another end thereof is disposed at a predetermined position with respect to the optical base, and which is larger in coefficient of thermal expansion than the optical base;
   a first nut which is feedably fitted to the feed screw;
   a flat spring in which one end thereof is fixed to the first nut; and
   a mirror arm which has a rotation shaft disposed at the rotation center of the wavelength selection mirror, and first and second arm portions formed in a substantially V-like shape and elongating from the rotation shaft,
   wherein the wavelength selection mirror is fixed to the first arm portion of the mirror arm, and another end of the flat spring is fixed to the second arm portion of the mirror arm.

2. The tunable laser source according to claim 1, further comprising:
   a second nut which is feedably fitted to the feed screw, and is disposed on a side of the another end of the feed screw with respect to the first nut;
   a plate which is fixed to the first nut, and is contacted with the second nut to prevent the second nut from rotating; and
   a compression spring disposed between the second nut and the first nut,
   wherein the first nut is larger in coefficient of thermal expansion than the feed screw.

* * * * *